US007084715B2

(12) United States Patent
Al-Taei et al.

(10) Patent No.: US 7,084,715 B2
(45) Date of Patent: Aug. 1, 2006

(54) COUPLING DEVICE

(75) Inventors: Sarmad Al-Taei, Swansea (GB); George Passiopoulos, Camberley (GB)

(73) Assignee: Nokia Corporation, Espoo (FI)

( * ) Notice: Subject to any disclaimer, the term of this patent is extended or adjusted under 35 U.S.C. 154(b) by 291 days.

(21) Appl. No.: 10/667,976

(22) Filed: Sep. 23, 2003

(65) Prior Publication Data

US 2004/0257168 A1 Dec. 23, 2004

(30) Foreign Application Priority Data

Sep. 27, 2002 (WO) ................................ PCT/IB02/04007

(51) Int. Cl.
*H01P 5/00* (2006.01)
*H03H 7/38* (2006.01)

(52) U.S. Cl. ...................................... 333/24 R; 333/33

(58) Field of Classification Search ............... 333/24 R, 333/33, 109, 110, 111, 112, 115, 116, 117, 333/118, 120, 246
See application file for complete search history.

(56) References Cited

U.S. PATENT DOCUMENTS 4,288,759 A * 9/1981 Stover ...................... 333/24 R
4,371,982 A * 2/1983 Hallford ..................... 455/327
6,825,738 B1 * 11/2004 Shumovich ................. 333/112

FOREIGN PATENT DOCUMENTS

| | | |
|---|---|---|
| DE | G 94 09 625.2 | 9/1994 |
| EP | 1 215 749 A1 | 6/2002 |
| FR | 1.528.085 | 4/1968 |
| JP | 56-62402 | 5/1981 |
| WO | WO 02/069440 | 9/2002 |

OTHER PUBLICATIONS

Triphathi, Vijai K.; "*Asymmetric Coupled Lines in a Inhomogenous Medium*"; IEEE Transaction on Microwave Theory and Techniques; vol. 23; No. 9; Sep. 1975; pp. 734–739.

Ou, W.P.; "*Design Equations for an Interdigitated Directional Coupler*"; IEEE Transactions on Microwave Theory and Techniques; vol. 23; Feb. 1975; pp. 253–255.

Al-Taei, S. et al.; "*Design of High Directivity Directional Couplers in Multilayer Ceramic Technologies*", Microwave Symposium Digest; 2001 IEEE MTT-S International; vol. 1, 2001; pp. 51–54.

* cited by examiner

*Primary Examiner*—Dean Takaoka
(74) *Attorney, Agent, or Firm*—Squire, Sanders & Dempsey LLP

(57) ABSTRACT

Conventional stripline implementations of couplers in Multilayer Ceramic Integrated Circuit (MCIC) technology incur a cost disadvantage when compared to an equivalent microstrip implementation. This is primarily due to the increased substrate thickness needed to achieve the required performance. Conventional stripline couplers significantly limit our ability to optimise for smaller substrate thickness and therefore overall cost. However, stripline couplers are needed for stacked integration scenarios and as building blocks for complex active and passive RF circuits in MCICs. A method of implementation that overcomes this practical disadvantages is therefore highly desirable. To this end, the present invention presents a novel coupling device structure that enable RF designers to use the stripline coupler configuration, by achieving required levels of performance with much reduced substrate thickness. The invention outlines a structured design procedure and presents simulation results confirming the validity of the technique. In particular, to achieve this, the present invention proposes a coupling device, comprising a substrate 1, a first conductive layer 2 covering a first surface of said substrate 1, at least two electromagnetically coupled lines 3*a*, 3*b* being provided opposite to said first surface and being covered by at least one cover layer 4, 5, wherein at least one short-circuit stub Stub A, Stub B is connected between at least one of said electromagnetically coupled lines and said first conductive layer.

19 Claims, 12 Drawing Sheets

(a) Broadside Coupled Stripline (b) Offset-Broadside Coupled Stripline (c) Broadside Coupled Microstrip (d) Offset-Broadside Coupled Microstrip Cross-section of four broadside coupled structures.

Figure 4. Conventional broadside coupled stripline coupler. Transmission line width W = 190 um; physical length L = 15 mm; substrate thickness 2.3 mm; structure designed in LTCC of Er = 7.8.

Figure 5. Meandered broadside coupled stripline coupler. Transmission line width W=190 um; physical length L= 9.75 mm; breadth B = 3.49 mm; substrate thickness 2.3 mm; structure designed in LTCC of Er = 7.8.

Figure 7. Compensated meandered broadside coupled stripline coupler. Transmission line width 210 um; physical length 8.75 mm; breadth 3.49 mm; substrate thickness 1.1 mm; structure designed in LTCC of Er = 7.8. Short-circuit stub total length 10 mm and width 125 um. Capacitors of 0.42pF

COUPLING DEVICE

FIELD OF THE INVENTION

The present invention relates to a coupling device. More particularly, the present invention relates to a coupling device resulting from a multilayer integrated circuit technology fabrication process.

BACKGROUND OF THE INVENTION

Coupling devices (referred to as couplers) in general, such as for example Hybrid 3 dB couplers, are essential circuit components which are increasingly being used for high performance applications in such diverse circuits as RF mixers, amplifiers and Modulators. In addition they can be used in a variety of other support functions such as the ones encountered in general RF signal and amplitude Conditioning and error signal retrieval systems.

The expression "hybrid" in connection with couplers means an equal split of power between two (output) ports of the coupler with respect to an input port. Hence a 3 dB coupler is a "hybrid" since:

$$10\log(\text{Power}_{out}/\text{Power}_{in})=-3\text{ dB}$$

$$\text{Power}_{out}/\text{Power}_{in}=10^{(-3/10)}=0.5$$

So the output power $\text{Power}_{out}$ of one of the output ports is half (−3 dB) of the input power $\text{Power}_{in}$, the other half emerges from the other output port. If we consider FIG. 2 (to be explained in greater detail later on) and say that port P1 is the input port, then port P4 is said to be the coupled port and port P2 is said to be the direct port with half the input power being output from each of the output ports. Port P3 is said to be isolated from port P1. Note that the output at the direct port will experience a phase shift dependent on the coupling length while the output at the coupled port will not experience a phase shift (with reference to the input supplied at the input port).

The use of couplers in the 1–5 GHz range though has been at the expense of large area of occupation required for such couplers and fabrication tolerance problems resulting from tight gap dimensioning for 3 dB coupling operation when implemented in PCB technology (PCB=Printed Circuit Board). More precisely, when implementing a coupler in PCB technology, it is necessary to accurately provide a gap between coupling lines of a coupler with the designed dimensions since otherwise the coupler will not perform properly.

To address fabrication issues, narrow-band equivalents that compromise even more the size of the circuit such as branch line couplers have been utilised. Other alternatives such as SMD type (SMD=Surface Mounted Device) hybrid couplers have been used that offer better size ratios but are still quite large for future small size increased functionality systems. Often SMD component type couplers require additional external matching components to optimise their performance in terms of isolation and matching as well as amplitude and phase balance and therefore even further compromise the circuit area. Stated in other words, the provision of externally provided SMD components for matching purposes further increases the entire size of the coupler and requires additional soldering processes for soldering the externally provided SMD components. The increased use of SMD components increases costs and the use of soldering connections compromises the environmental friendliness and reduces the reliability of a manufactured subsystem module since each solder connection represents a potentially source of error.

Stripline technology has also been utilised for the design of high performance couplers but its suffers from the need to accommodate for larger volume/size for a given component inflicting additionally more materials costs.

Low loss performance can also be an issue especially in LNA designs (LNA=Low Noise Amplifier) as well as in high efficiency power amplification and linearisation applications. For such applications a fraction of a dB improvement can be advantageous. Current designs offer typically 0.3 dB loss performance per coupler.

To rectify the above problems and address the performance requirements of future miniaturised circuit subsystems, wideband couplers in terms of isolation, matching and amplitude and phase balance are required that are additionally fabrication tolerance resistant and of much smaller size than its predecessors.

Size can be decreased by using an appropriate integration technology as well as a miniaturisation circuit technique. Multilayer integrated circuits such as multilayer ceramic LTCC/HTCC (LTCC=Low Temperature Cofired Ceramics, HTCC=High Temperature Cofired Ceramics) technologies have been identified as a technology of great miniaturisation potential since three dimensional design flexibility is combined with ceramic materials of high dielectric constant ( ). Loss performance is enabled by the careful choice of materials and circuit geometry as well as topology.

Isolation/matching and amplitude and phase balance performance can be optimised by using a suitable circuit technique or geometry.

FIG. 1 shows an example of a practical multilayer stack-up as known for dense integration in multilayer ceramic technologies such as LTCC/HTCC. As can be seen in FIG. 1, different ground planes, which achieve isolation, separate different integration levels. This high-density integration scenario relies on the use of stripline components, which as stated above suffers from an increase in area/volume for a given component inflicting additionally more material costs.

Stated in other words, Monolithic integration of passive components into multilayer passive substrates is highly useful for addressing the size, cost, and performance trade-offs that dominate much of the design efforts in the mobile telecommunication industry. Low Temperature Cofired Ceramic (LTCC) technology is an important example of an available multilayer substrate. FIG. 1 shows in rough outline an example of a practical multilayer stack-up in LTCC using two different ceramic thicknesses. The top substrate layer is utilised for bias and wirebound MCIC circuitry, with the bottom layer used for soldering packaged components (e.g. using ball grid array BGA). The two middle layers are used for controlled impedance transmission lines and other passive components such as parallel plate capacitors, inductors, couplers, baluns and power dividers. It can be seen that for adequate isolation between circuitry of different design layers the passive elements need to be implemented as stripline components with different design layers separated by ground planes.

The implementation of stripline couplers carries a significant disadvantage in requiring a much larger thickness of substrate as compared to its microstrip counterpart to achieve similar performance for the same geometry. Hence when optimising for cost by reducing the number of layers used, the performance of stripline couplers will suffer.

FIG. 2 shows an equivalent circuit diagram of a conventionally known coupler. Basically, a coupling device consists of a pair of coupled lines 3*a*, 3*b*. Each line has two ports for inputting/outputting electrical and/or electromagnetic signals to be coupled. Thus, as shown in FIG. 2, the line 3*a* has ports P1, P2, while the line 3*b* has ports P3, P4. Each port P1 through P4 is terminated with a termination impedance $Z_0$. In a 50 Ohms system, the value of $Z_0$ is set to 50 Ohms. The lines 3*a*, 3*b* have equal length which is expressed in terms of the wavelength for which the coupler is designed. The parameter le° denotes the electric length of the coupler which is measured in degrees (°). For example, for the coupler shown in FIG. 2 the length is assumed to be λ/4, with λ/4 corresponding to the center frequency of operation for which the coupler is designed. Thus, in such a case, a signal fed to the coupler at port P1 and used as a reference (indicated by "0°") is coupled to the port P4 (coupled port) with its phase unaltered. Port P3 is isolated from port P1, which means that no power reaches port P3 from port P1. The signal at port P2 (the direct port) is shifted with reference to the signal input at port P1 as indicated by +90°. Note that in case of a 3 dB coupler as an example, the power input at port P1 is split between ports P2 (direct port) and P4 (coupled port). Nevertheless, other line lengths such as λ/2, or odd multiples of λ/4 such as 3λ/4 are possible. Also, the lines could have different lengths, while in such a case only the length of the lines over which coupling takes place represents an effective coupling length (electric length le in [°] of the coupler). The coupler, i.e. the coupling lines, may be described in terms of the even and odd propagation modes of electromagnetic waves travelling there through and their respective characteristic impedances $Z_{oo}$, $Z_{oe}$ and phase velocities $\upsilon_{oe}$ and $\upsilon_{oo}$ and the electric length le of the coupling lines.

In 3 dB coupling in a 50 Ohms system, one needs to design the lines to have impedance values $Z_{oo}$ and $Z_{oe}$ of 20.7 and 120.7 Ohms respectively. The above arrangement though assumes equal phase velocities for the even and the odd modes i.e. $\upsilon_{oe}=\upsilon_{oo}$. This assumption holds for homogeneous couplers such as stripline couplers.

Zoe is primarily effected by the thickness of the substrate and transmission line widths. Often, in practical implementations, the substrate thickness is less then that required for achieving the correct Zoe. This may be due to size, cost or reliability considerations, or a combination of all. The reduced Zoe impacts adversely on the amplitude and phase balance of the coupler, as well as on the matching and isolation.

Reduction in Zoe can be dealt with in two ways, either we increase the substrate thickness incurring significant material costs and increasing the volume of the component; or reducing the transmission line width, which is limited by manufacturing requirements and tolerance limitations. Reducing the transmission line width has an adverse effect on Zoo, which imposes a limit on how much we can ultimately reduce the width and still be able to meet the Zoo requirement.

The present invention to be described herein below is described with reference to stripline couplers. Nevertheless, the proposed structural modification according to the present invention is also applicable to microstrip couplers. Also, it is not essential for the present invention whether broadside coupled or edge coupled couplers are concerned. However, in order to describe the present invention, a focus in the description is laid on broadside coupled stripline couplers, without imposing any limitation on the invention.

FIG. 12 shows in a rough outline the basic difference between a stripline and microstrip arrangement, respectively. The left hand portion of FIG. 12 shows a stripline arrangement, while the right hand portion shows a microstrip arrangement (both edge coupled as the conductive layers are placed in the same layer with the edges facing each other). It is an important property of any lossless coupled transmission lines (coupling lines) placed in a uniform dielectric substrate (homogeneous substrate and/or symmetrical) that it supports a pure TEM mode of propagation. A common example of these types of lines is STRIPLINE, as shown in FIG. 12, left portion. However if a transmission line is placed in an inhomogenous (and/or non-symmetric) dielectric substrate it can no longer support fully-TEM propagation because the electromagnetic wave-now propagates mostly within the substrate, but some of the wave is now able to propagate in air also. The most common example of this is MICROSTRIP also shown in FIG. 12, right portion. Stripline couplers are encased in a homogenous substrate where the electromagnetic fields of the coupler are confined within the substrate by the two ground planes. While for a microstrip line its electromagnetic propagation takes place mainly within the substrate (in fact most of the power propagates within the substrate), but some of the power propagates outside the substrate which is usually air.

FIG. 3 shows basic structural arrangements in cross section of broadside coupled structures. FIG. 3 shows the typical structures utilised in the design of Hybrid-Couplers in Multilayer ceramic technology. The Broadside Coupled structures are a very useful design structure that can adjust the amount of coupling by offsetting the two coupled-transmission lines. FIG. 3 comprises FIGS. 3*a, b, c*, and *d* illustrating (FIG. 3*a*) a broadside coupled stripline (without offset between coupling lines), (FIG. 3*b*) an offset-broadside coupled stripline, (FIG. 3*c*) a broadside coupled microstrip (without offset between coupling lines), (FIG. 3*b*) an offset-broadside coupled microstrip.

Thus, as shown in FIG. 3*c* and *d*, a respective coupling device, comprises a substrate 1, a first conductive layer 2 covering a first surface of said substrate 1, at least two electromagnetically coupled lines 3*a*, 3*b* being provided opposite to said first surface and being covered by at least one cover layer 4, 5. Additionally, as shown in FIG. 3*a* and *b*, said at least one cover layer 4, 5 is covered by a second conductive layer 2'. Said at least two lines 3*a*, 3*b* are arranged at different distances from said first surface of said substrate 1, wherein the difference between the distances in which said at least two lines 3*a*, 3*b* are arranged from said first surface of said substrate 1 is determined by a thickness of a first cover layer 4 covering a first line 3*b* of said at least two lines. As shown, the first line 3*b* and a second line 3*a* of said at least two lines are arranged such that they at least partly overlap each other (FIG. 3*b* and *d*), the amount of overlap adjusting the degree of electromagnetic coupling between said at least two lines.

A second cover layer 5 is arranged to cover at least a second line 3*a* of said at least two lines. Of course, said at least one cover layer 4, 5 can be of the same material as said substrate 1, which is made of a dielectric material of a relative dielectric permittivity $\epsilon_r$. Said conductive layers 2, 2' are connectable to ground potential.

FIG. 4 shows a specific comparative example for comparison with the present invention (still to be described later in this document). The example of FIG. 4 is based on a broadside coupled stripline coupler as previously shown in FIG. 3*a* above. In detail, FIG. 4 shows a perfect broadside-coupled stripline coupler. The results shown derive from momentum-based simulations (2.5-D EM simulator). The coupler is designed to exhibit Zoe=120.7 Ohms and Zoo=20.7 Ohms with Ve=Vo, at a central frequency of 1.8 GHz.

However, to achieve this response an LTCC substrate of thickness 2.3 mm, with ∊r=7.8 (and layer 4 thickness of 0.094 mm) was required. The coupler according to FIG. 4 is 15 mm in length to achieve the required central frequency. However, one can reduce this length by meandering the coupler as shown in FIG. 5, which shows a further comparative example. Meandering introduces structural discontinuities which degrade the performance by introducing asymmetry for the normally symmetrical normal modes of propagation. This manifests itself as an inequality in the normal-mode phase velocities, Ve≠Vo. This accounts for the reduction in performance observed in FIG. 5.

If the substrate thickness is reduced by more than half from 2.3 mm to 1.1 mm, one can observe a further reduction in the performance of the stripline broadside-coupled coupler. This is due to the degradation of Zoe, which is therefore to be compensated for.

Note also, that as the production technology for such devices the multilayer integrated circuit technology which is assumed to be well known to those skilled in the art may be used so that a detailed description of the method for production of such devices is considered to be dispensable.

To the best of our knowledge there have not been suggested any techniques that compensates the degradation of Zoe.

SUMMARY OF THE INVENTION

Consequently, it is an object of the present invention to provide a coupling device which is free from such drawbacks due to a degradation of Zoe.

According to the present invention, this object is for example achieved by a coupling device, comprising a substrate, a first conductive layer covering a first surface of said substrate, at least two electromagnetically coupled lines being provided opposite to said first surface and being covered by at least one cover layer, wherein at least one short-circuit stub is connected between at least one of said electromagnetically coupled lines and said first conductive layer.

According to favourable further developments said at least one cover layer is covered by a second conductive layer, and at least one short-circuit stub is connected between at least one of said electromagnetically coupled lines and said second conductive layer;

an even number of electromagnetically coupled lines is provided, and the number of short-circuit stubs connected to said first conductive layer is equal to the number of short-circuit stubs connected to said second conductive layer;

said short-circuit stub is connected to an electromagnetically coupled line at half the electrical length of said line;

said short-circuit stub is buried in the layered structure of the coupling device;

a short-circuit stub is designed to have a specific impedance and electrical length.

Advantageous further developments are as defined in respective further dependent claims.

Accordingly, with the present invention being implemented to a coupling device, the following advantages can be achieved:

The degradation of Zoe is compensated for with the use of one or more of the short-circuit stubs connected to the coupled line, e.g. introduced at the centre thereof. By compensating for Zoe using the stubs and further by compensating for Ve\Vo mismatch using capacitors to ground, significant improvements to the performance of the coupler can be achieved.

This invention thus deals with a simple alternative technique to compensate for the reduced Zoe. In turn the technique is applied for the case of a practical multilayer ceramic LTCC broadside 90-degree Hybrid coupler therefore giving rise to novel component structures.

The novel compensated technique according to the present invention that has been suggested enables the use of Broadside Coupled Line components embedded in Multilayer Structures. The technique enables a high performance combined with miniaturised size and reduced substrate thickness, and offers in this way the best of all possible design scenario in terms of wideband performance; reduced size; and reduced cost.

Such novel components are needed for use of high performance miniaturised mixers and low noise amplifier LNA applications that have been suggested for $4^{th}$ Generation Base Station RF Front End Modules and enabling linearisation techniques instrumentation.

In this invention there is thus proposed a circuit technique that optimises the coupler performance in terms of Isolation, Matching, and Amplitude and Phase balance. The technique enables the use of couplers with greatly reduced substrate thickness. This allows the implementation of coupled line couplers with high performance in reduced thickness multilayer configurations that have been optimised for size, cost and reliability. The greatest advantage of the technique is for stripline couplers (while it can nevertheless also be applied to microstrip couplers), which are essential for dense integration in Multilayer Ceramic technologies (see FIG. 1), such as LTCC/HTCC.

The proposed technique allows significant reduction in substrate thickness (i.e. reduction in volume). The technique is also suited to multilayer IC technologies such as the ones encountered for example in Multilevel Metal SiGe and Multilayer Thin Film processes. It should be noted though that the cost of implementing couplers in the 1–6 GHz region well justifies the use of Multilayer Ceramic Integrated Circuit Technology (e.g. LTCC) as opposed to the significantly more expensive Si/GaAs IC and thin film approaches.

Thus, stated in other words, the invention presents a new compensation technique for stripline couplers that retains high performance whilst using a smaller substrate thickness. The technique utilises at least one short circuit stub at e.g. the center of the coupled line structure. This has a network circuit response equivalent to an increase in the parasitic mode (equivalent to the even-mode in symmetric structures) impedance of the coupler.

BRIEF DESCRIPTION OF THE DRAWINGS

The above and other objects, features and advantages of the present invention will be more readily understood upon referring to the accompanying drawings, in which.

DETAILED DESCRIPTION OF THE EMBODIMENTS

Figure 1:
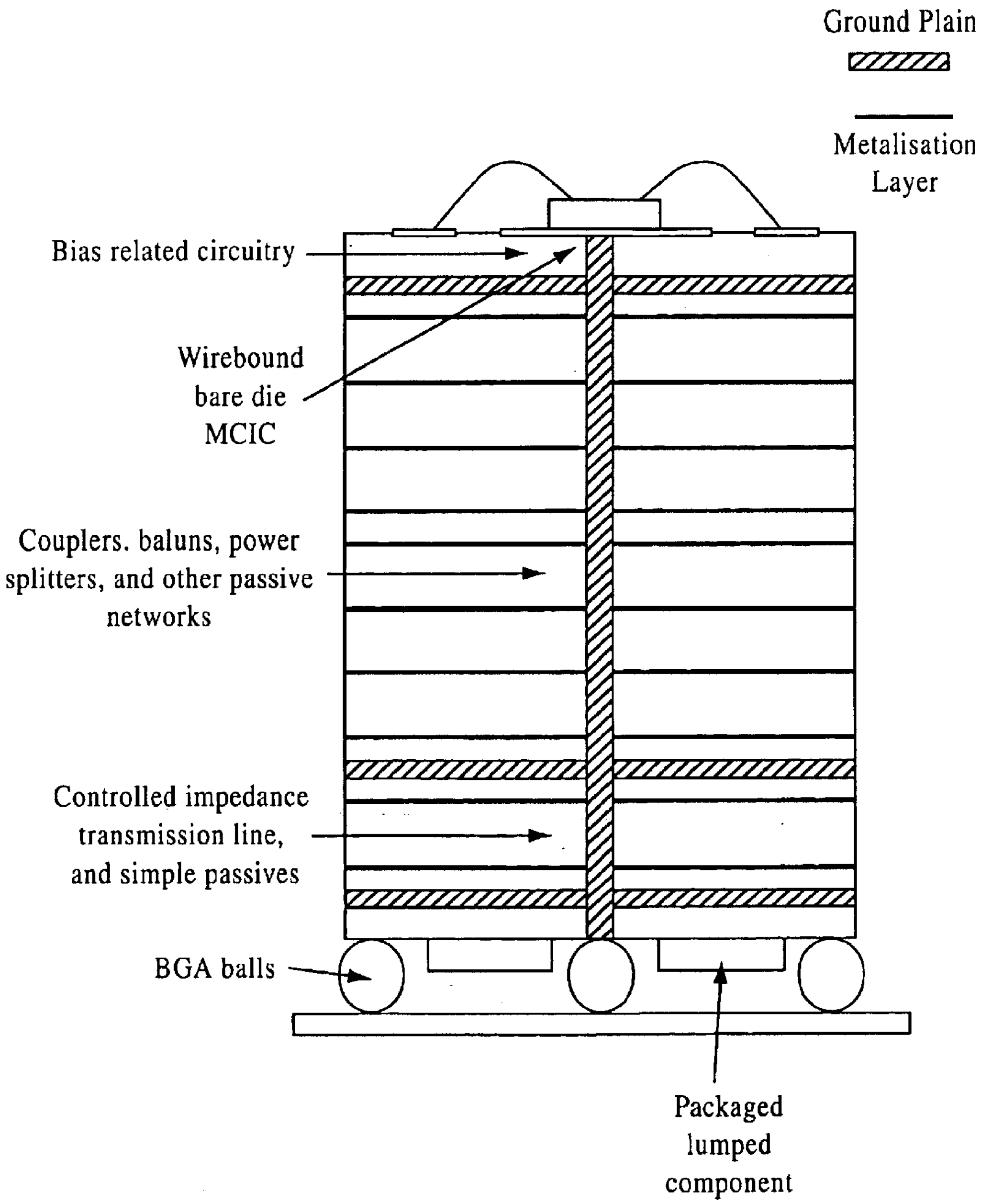
Fig. 1 PRIOR ART
FIG. 1 shows an example of a practical multilayer stack-up as known for dense integration in multilayer ceramic technologies such as LTCC/HTCC

Subsequently, the present invention will be described in detail with reference to the accompanying drawings. Throughout the drawings, the same reference numerals and reference signs denote the same or like components.

Basic Embodiment (Not Shown in the Figures):

With reference to coupling devices as shown in FIGS. 3*a* to 3*d*, the present invention basically concerns a coupling device, which comprises a substrate 1, a first conductive layer 2 covering a first surface of said substrate 1, at least two electromagnetically coupled lines 3*a*, 3*b* being provided opposite to said first surface and being covered by at least one cover layer 4, 5.

According to the present invention, at least one short-circuit stub is connected between at least one of said electromagnetically coupled lines and said first conductive layer.

Figure 2:
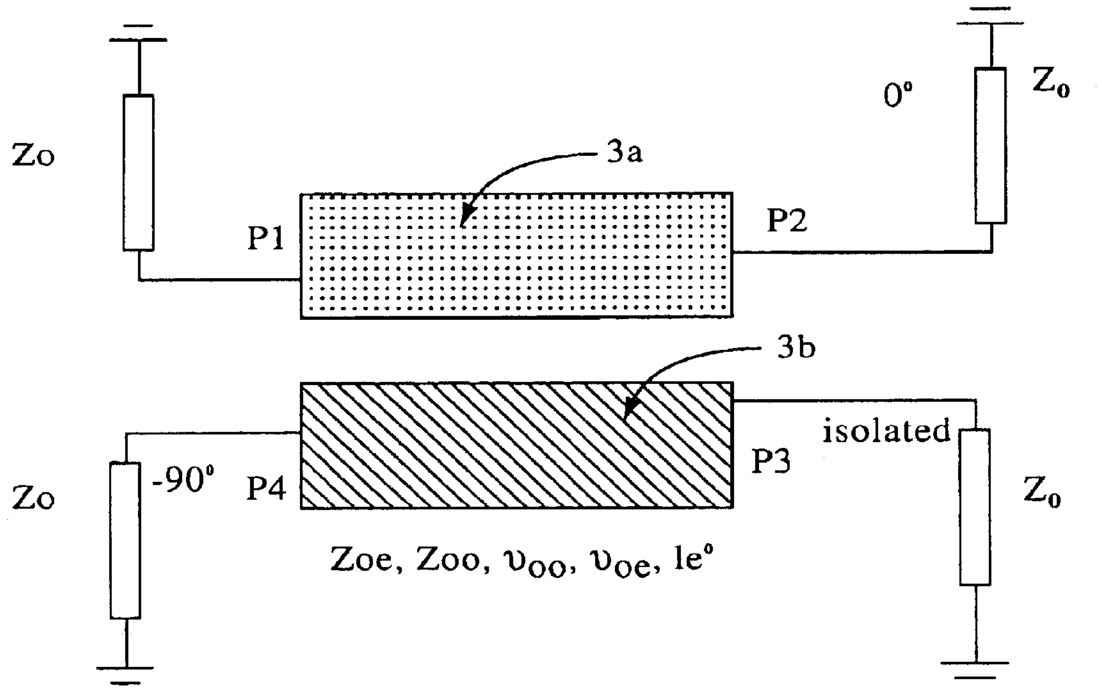
Fig.2 PRIOR ART
FIG. 2 shows an equivalent circuit diagram of a conventionally known coupler.

This means that with reference to FIG. 6, according to the basic embodiment (not shown in FIG. 6) a stub Stub A or Stub B is connected to the arrangement which is in other respects identical to the structure shown in and described with reference to FIG. 2.

Figure 6:
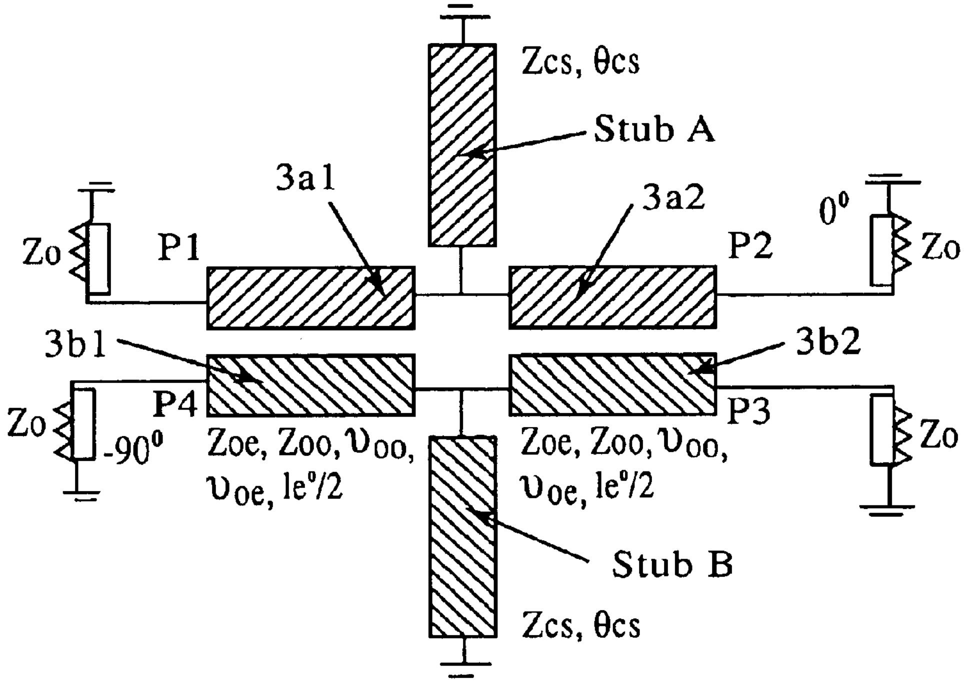
FIG. 6 shows an equivalent circuit diagram of a first embodiment of the invention.

First Embodiment (FIG. 6):

Considering the first embodiment shown in FIG. 6, said at least one cover layer 4, 5 is covered by a second conductive layer 2', and at least one short-circuit stub Stub A is connected between at least one of said electromagnetically coupled lines 3*b* (3*b*1, 3*b*2) and said second conductive layer. Stated in other words, two stubs Stub A and Stub B are connected to the arrangement, one stub being connected to a respective one of said coupled lines.

It is to be noted that in case an even number of electromagnetically coupled lines is provided (as in FIG. 6), the number of short-circuit stubs connected to said first conductive layer 3*a* (3*a*1, 3*a*2) is equal to the number of short-circuit stubs connected to said second conductive layer 3*b* (3*b*1, 3*b*2).

Furthermore, as shown in FIG. 6, said short-circuit stub and/or stubs is/are connected to an electromagnetically coupled line at half the electrical length of said line (le°/2). However, this is not necessarily the case for all embodiments but has proven to be practical in case of e.g. a λ/4 coupler is concerned. Then, an electromagnetically coupled line 2*a*, 3*b* is considered to consist of two parts 3*a*1 and 3*a*2, and 3*b*1 and 3*b*2, respectively, each having half the electrical length, in such a case λ/8, so that after an electrical length of λ/8, a respective stub is connected to the line.

Modification (Not Shown in Figures):

In case, however, a 3λ/4 coupler is concerned, a line may be regarded to be composed of three parts, each having an electrical length of λ/4. Then two stubs may be connected per line, each stub being connected after an electrical length of λ/4.

More generally, in case a nλ/4 coupler is concerned (where n is an integer) a line may be regarded to be composed of n parts or sections, each having an electrical length of λ/4. Then n-1 stubs may be connected per line, each stub is separated from the preceding/subsequent one by λ/4. However, λ/4 is only an example for a length of a section and other section lengths can be employed.

However, it should be noted, that for nλ/4 couplers any number or combination of stubs can be employed without loss of generality. Stated in other words, an n-section coupler would have n-pairs of stubs or less.

Further Modification (Not Shown in Figures):

The present invention is described with a focus on stripline couplers. If, however, the present invention is applied to microstrip couplers, only one conductive layer is present. Then, of course, the stubs are connected to said single available conductive layer.

In any case, said short-circuit stub is buried in the layered structure of the coupling device, as will become apparent with reference to subsequent cross sectional views in the Figures.

Referring back to the first embodiment as shown in FIG. 6, it is apparent that (as mentioned above) the technique according to the present invention involves the incorporation of at least one, in the shown example, two short-circuit stubs, here at the centre of the coupled line structure. Choosing suitable values of short-circuit transmission line impedance Zcs and electrical length θcs, for the two short-circuit stubs, will accomplish compensation for Zoe. The corresponding electrical circuit equivalent of the proposed novel circuit technique is shown in FIG. 6.

The impedance and electric length values of Zcs and θcs, respectively, required for compensating the Zoe depend on the degraded and required values of Zoe.

Figure 9:
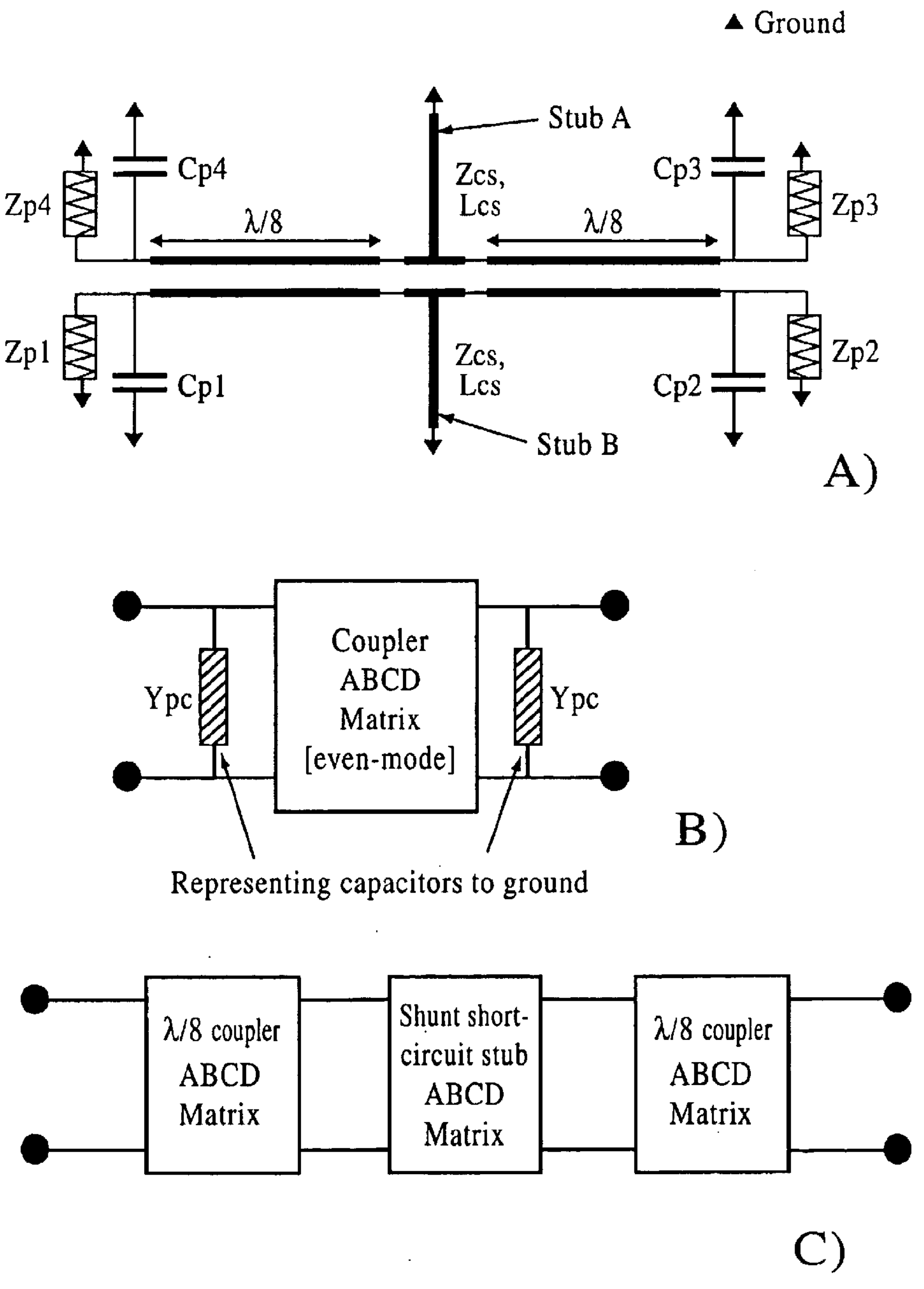
FIG. 9 an equivalent circuit diagram of a second embodiment of the invention used for explanations on the dimensioning of stub impedance Zcs and electrical stub length Lcs.

Both approximate as well as rigorous mathematical approaches that estimate the actual value of Zoe and the required values of Zcs and θcs for compensation to an arbitrary value of Zoe were developed and are outlined herein below with reference to FIG. 9.

Second Embodiment (FIG. 7):

The homogeneity of the stripline coupler is disturbed by the addition of the short-circuit stub. However, by the use of a principle that may be referred to as "Capacitors-to-Ground", and described in patent application no. PCT/EP01/02249 by the same inventors, one can rectify this problem and preserve overall performance. The disclosure of C this earlier document is incorporated herein by reference.

In brief, according to this principle, at least one capacitor C1, C2, C3, C4 is connected between a first end of at least one of said at least two lines 3*a*, 3*b* and said first conductive layer 2 (for microstrip couplers). In case of stripline couplers, additionally or alternatively, at least one capacitor C1, C2, C3, C4 is connected between a first end of at least one of said at least two lines 3*a*, 3*b* and said second conductive layer 2'.

As regards the capacitors, a respective capacitor C1, C4 is constituted by a conductive member Cp1, Cp4 facing a conductive layer 2, 2' and an electrical connection W1, W4 from said first end of said at least one of said at least two lines 3*a*, 3*b* to said conductive member Cp1, Cp4. Said connection is for example a via connection.

The capacitance of said capacitor is determined by the area of said conductive member (CP1, CP4), the distance between said conductive member (CP1, CP4) and said conductive layer (2, 2') covering said first surface of said substrate (1), and the dielectric constant of said substrate.

Figure 7:
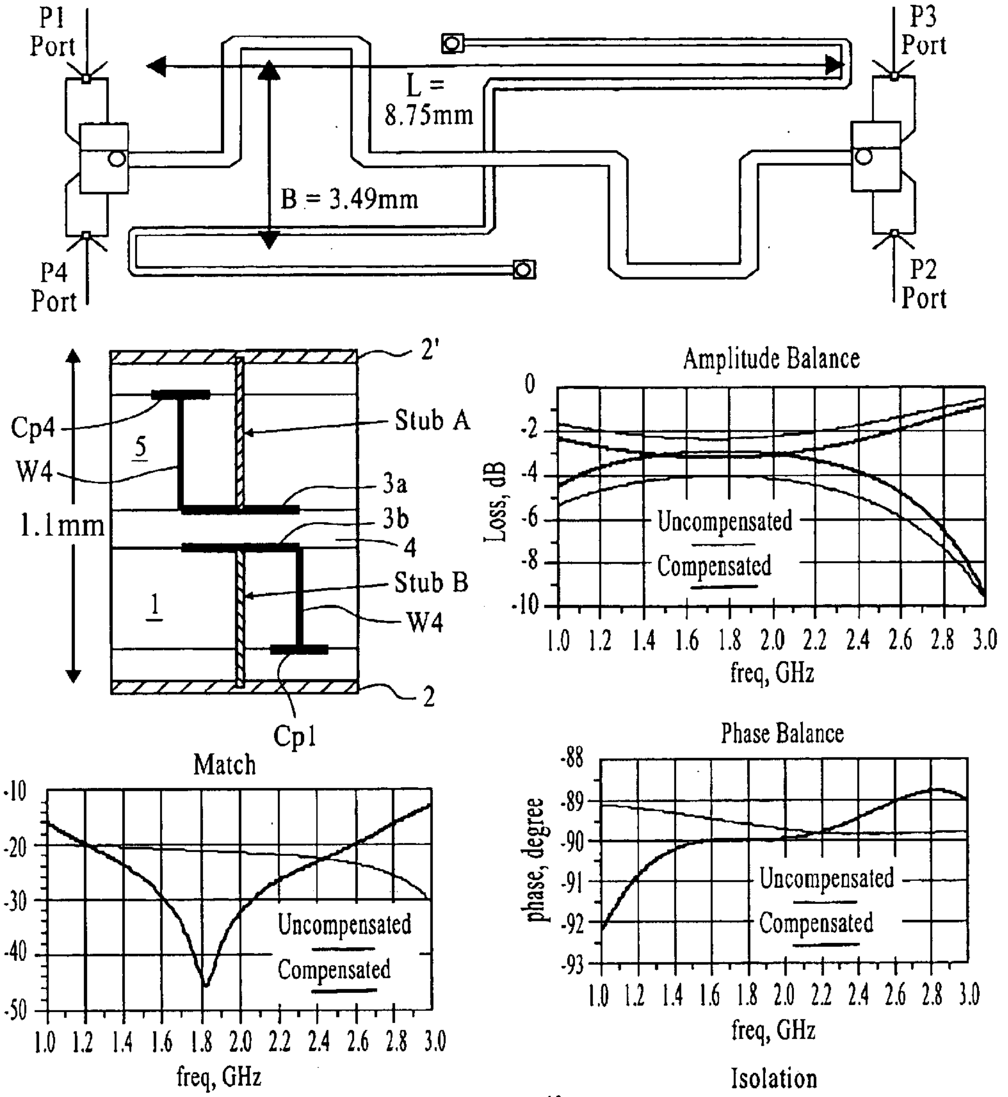
FIG. 7 shows a layout and cross-section of a second embodiment of the present invention together with performance charts.
Figure 7:
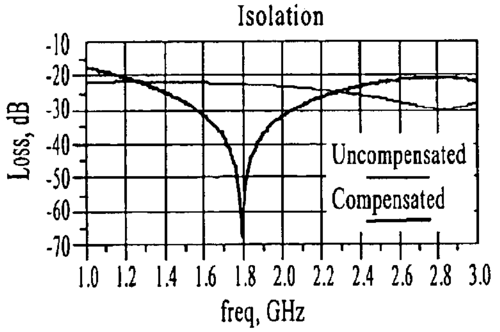

FIG. 7 shows a layout and cross-section of such a second embodiment of the present invention together with performance charts, which is based on the first embodiment (see FIG. 6) but additionally includes capacitors Cp1, Cp4 for further compensation purposes. It is to be noted that the cross sectional view contained in FIG. 7 is actually "composed" of two partial cross sections in the layout schematic on top of the Figure. Namely, a first partial cross section including the capacitors Cp1, Cp4 being provided at one end of the electromagnetically coupled lines and a second partial cross section in the middle of C the structure where the stubs are connected to the lines.

Modifications:

It is to be noted that the modifications as outlined herein above in connection with the basic and/or the first embodiment are also applicable to the second embodiment.

Based on the second embodiment as an example, the subsequent sections will present a further overview of the technique and derive applicable design equations for the proposed design methodology and also simulation results to demonstrate what is achievable.

It is known that a pair of coupled lines can be modelled as the superposition of two normal modes. For the general case of a uniformly coupled asymmetric four-port, the modes are referred to as the common (c-mode) and parasitic (π-mode), as descibed or example by Triphathi, Vijai K. in "Asymmetric Coupled Lines in a Inhomogeneous medium"; IEEE Transactions on Microwave Theory and Techniques; Vol. 23; No. 9; September 1975; P. 734–739. These modes degenerate into the odd and even modes, respectively, for a symmetric structure. In this work we will consider only symmetric stripline structures, although, the principles developed in this section can easily be extended to a more general treatment, e.g. of asymmetric structures such as microstrip couplers.

We can design a coupler with arbitrary coupling and characteristic port impedance with appropriate selection of normal mode parameters. As discussed by Ou W. P. in "Design Equations for an Interdigitated Directional Coupler"; IEEE Transactions on Microwave Theory and Techniques; Vol. 23; February 1975; P.253–255, we can say that to design a 50-Ohms, 3-dB coupler we must provide a structure with even-mode impedance (Zoe) of 120.7-Ohms and odd-mode impedance (Zoo) of 20.71-Ohms. To find the physical dimensions that correspond to the required normal mode impedance we can refer to semi-empirical formulae in literature or utilise anyone of the many software packages available, although most would be limited to specific geometries. The alternative would be to use normal-mode extraction equations expressed in terms of network parameters, to accomplish the same in a more generic fashion. Al-Taei, S.; et al; in "Design of High Directivity Directional Couplers in Multilayer Ceramic Technologies"; Microwave Symposium Digest; 2001 IEEE MTT-S International; Volume: 1; 2001; P. 51–54 presents such expressions as a function of S-parameters.

These expressions can be used in conjunction with optimisation functions available in standard design packages such as HP-ADS to produce a physical design.

Figure 8:
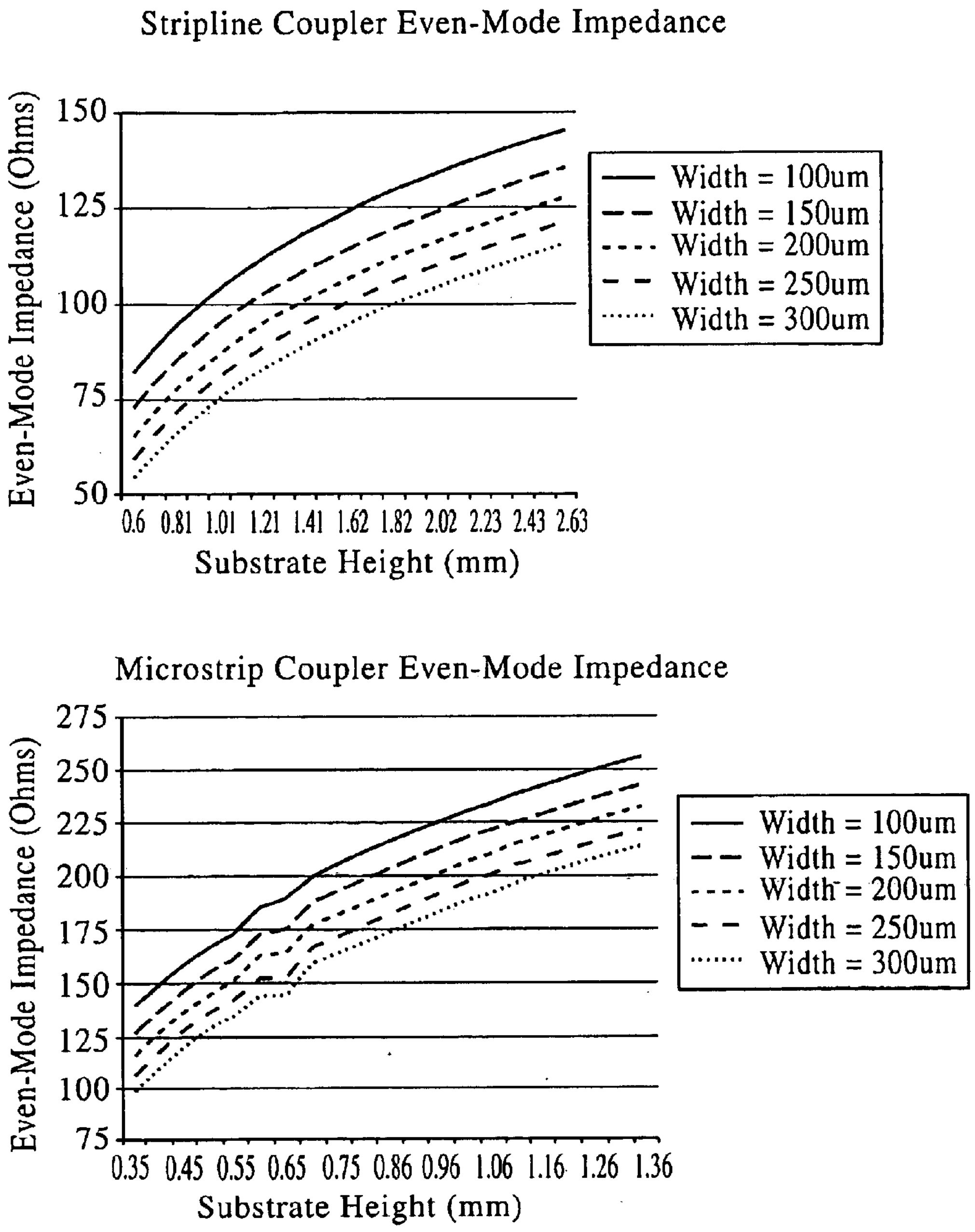
FIG. 8 shows diagrams plotting even-mode impedance versus substrate height for stripline and microstrip couplers.

To obtain an impression of how substrate thickness affects the even-mode behaviour of stripline broadside-coupled couplers, FIG. 8, top of page, illustrate the change in Zoe for variations in substrate height, for transmission line widths of 100, 150, 200, 250 and 300 μm; a layer 4 thickness of 0.094 mm; and Er=7.8). It is useful to compare the result in FIG. 8, top of page with that in FIG. 8, bottom of page, which shows the result of a microstrip broadside-coupled coupler. It can be seen that even with half the substrate thickness Zoe is still more than 50% greater in the microstrip coupler than its equivalent stripline implementation. So, in order to implement a 3-dB, 50-Ohm stripline broadside coupler we would require a substrate thickness of at least 1.5 mm for a transmission line width of 100 μm. An equivalent microstrip broadside-coupler would require a substrate thickness of only 0.5 mm, hence three times less ceramic. We therefore need a simple technique that will allow us to reduce the substrate thickness of a stripline coupler while still preserving the performance over a bandwidth of interest.

The inclusion of at least one short circuit-stub of specific impedance (Zcs) and electrical length (θcs) can accomplish compensation for the reduction in Zoe. FIG. 9*a* shows a schematic representation of the compensated coupler. Capacitors Cp1 to Cp4 to ground are included to accomplish normal mode phase velocity equalisation as is shown by Al-Taei, S.; et al; in "Design of High Directivity Directional Couplers in Multilayer Ceramic Technologies"; Microwave Symposium Digest; 2001 IEEE MTT-S International; Volume: 1; 2001; P. 51–54, and/or PCT/EP01/02249 which improves coupler directivity.

We can derive first approximate design equations for θcs and Cpn (the capacitance to ground), by considering the coupler in terms of its normal mode ABCD-matrix representation in series with a shunt admittance (as shown in FIG. 9*b*). The coupler ABCD-matrix includes the shunt short-circuit stub which can be factored in as shown in FIG. 9*c* (Note that a λ/4 coupler is concerned and the stub is located at half of the line length, i.e. at λ/8). We can write down an ABCD-matrix description of FIG. 9*c*, in terms of the even-mode as follows in equation (1):

$$\frac{1}{2}\begin{bmatrix} Zoe\cdot Ycs\cdot\cot\theta sc & j2\cdot Zoe + jZoe^2\cdot Ycs\cdot\cot\theta sc \\ \frac{j2}{Zoe} - jYcs\cdot\cot\theta cs & Zoe\cdot Ycs\cdot\cot\theta cs \end{bmatrix} \tag{1}$$

Figure 3:
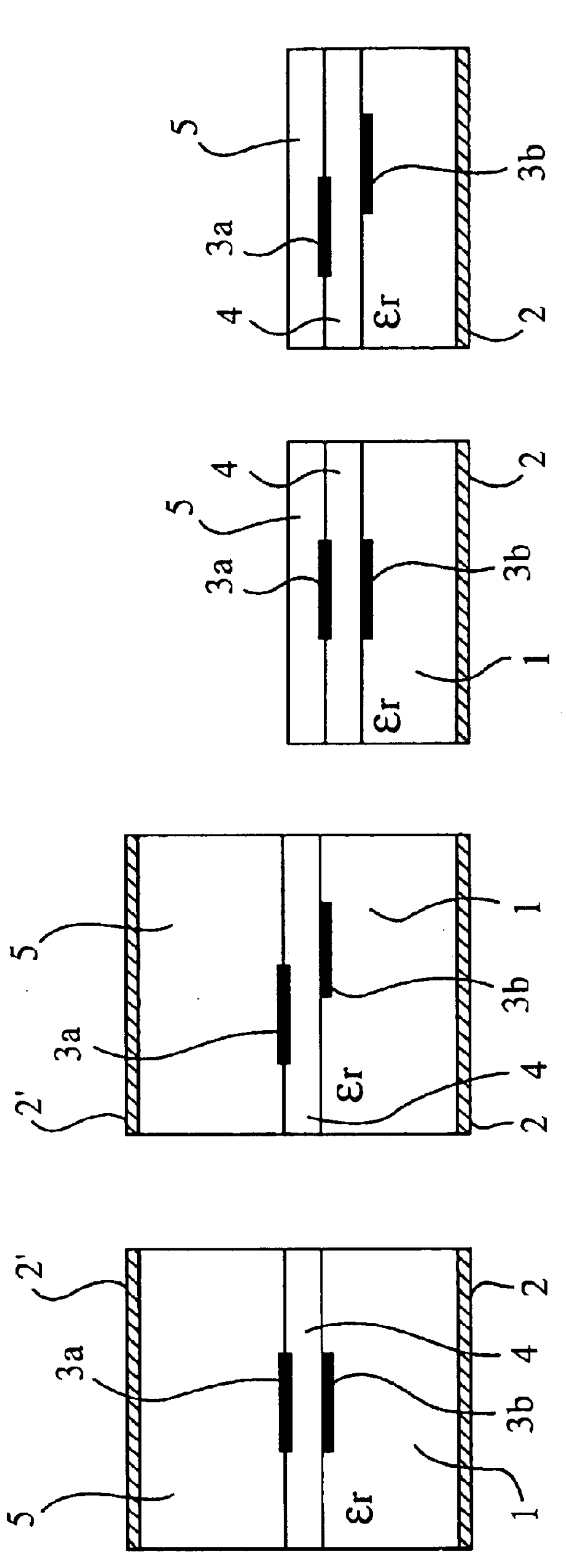
Fig.3 PRIOR ART
FIG. 3 shows basic structural arrangements in cross section of broadside coupled structures.
Figure 4:
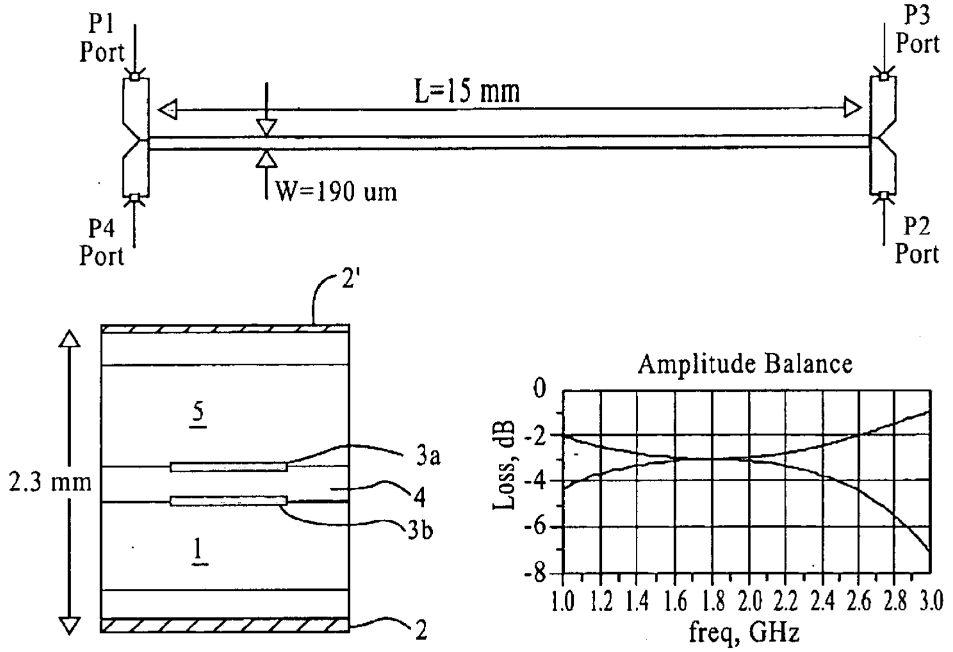
Fig.4 PRIOR ART
FIG. 4 shows a specific comparative example together with performance charts for comparison with the present invention.
Figure 4:
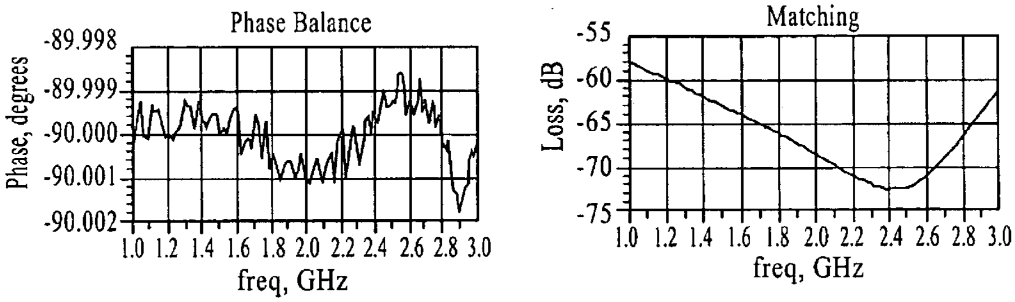
Fig.4 PRIOR ART
Figure 4:
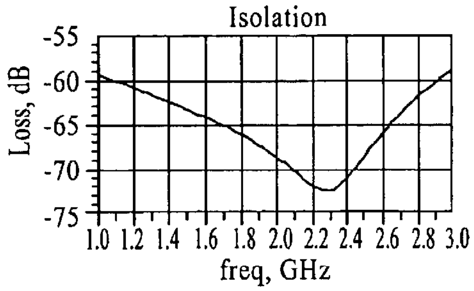
Fig.4 PRIOR ART
Figure 5:
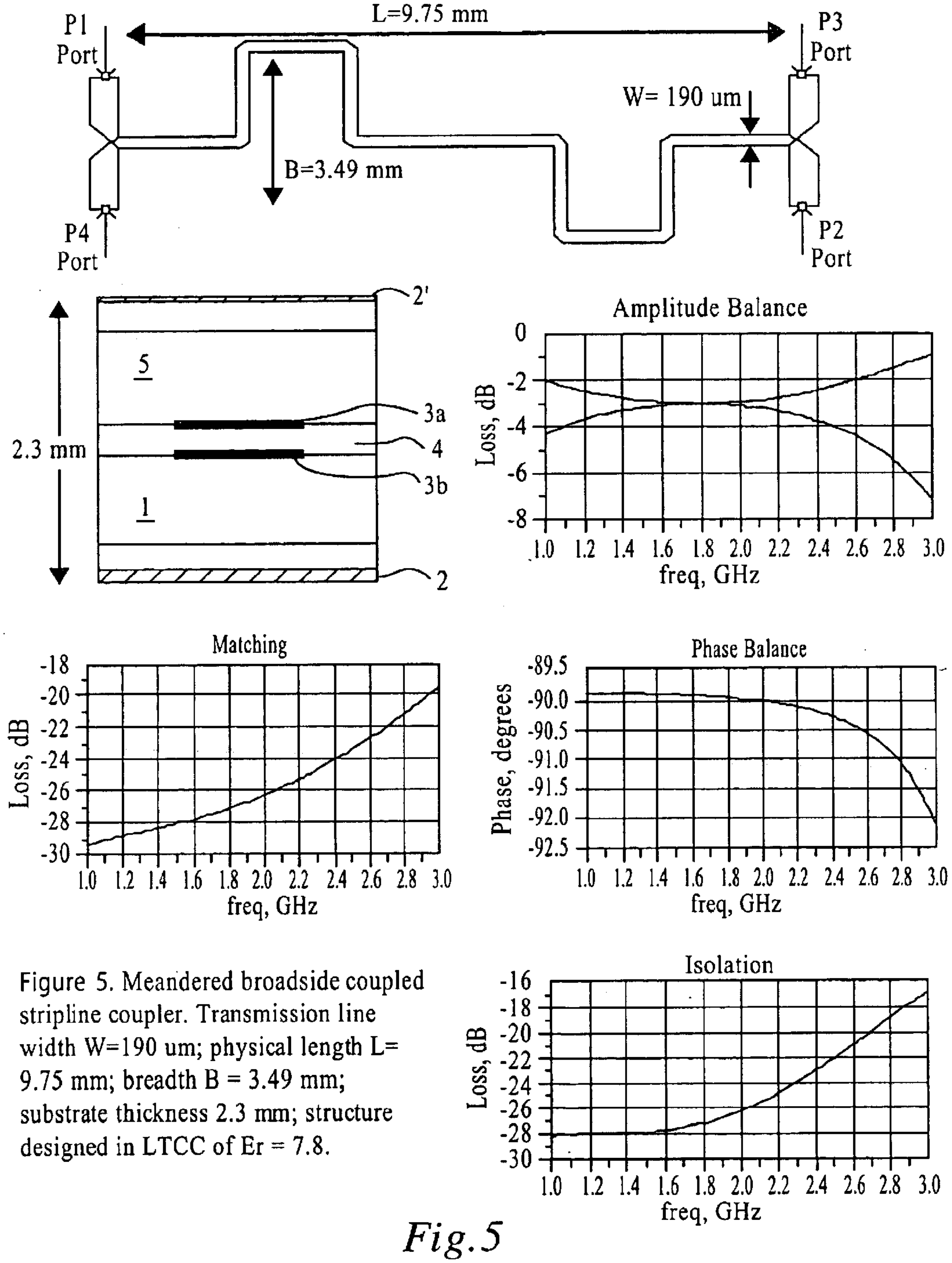
Fig.5 PRIOR ART
FIG. 5 shows a further comparative example together with performance charts for comparison with the present invention.

By the inclusion of the shunt-capacitance into the ABCD-matrix description we end up with a description of FIG. 9*b*, which is the ABCD-matrix of the full compensated coupler as in FIG. 3*a*. By equating the compensated coupler with that of an idealized coupler ABCD-matrix description, with Zoea denoting the desired value of the even-mode impedance, we obtain the following expressions:

$$Ycs\cdot\cot\theta cs = \frac{2\cdot\omega\cdot C_{pc}}{1-\omega\cdot C_{pc}\cdot Zoe} \tag{2}$$

$$Ycs\cdot\cot\theta cs = \frac{2\cdot(Zoea - Zoe)}{Zoe^2} \tag{3}$$

$$Ycs \cdot \cot\theta cs = \frac{\begin{pmatrix} Yoea + \\ \omega^2 \cdot C_{pc}^2 \cdot Zoe - \\ Yoe \end{pmatrix}}{\begin{pmatrix} \omega \cdot C_{pc} \cdot Zoe - \\ 0.5 - \\ 0.5 \cdot \omega^2 \cdot C_{pc}^2 \cdot Z^2oe \end{pmatrix}} \quad (4)$$

From (2) and (3) we get:

$$C_{pc} = \frac{(Zoea - Zoe)}{\omega \cdot Zoe \cdot Zoea} \quad (5)$$

From (3) we get:

$$\cot\theta cs = \frac{2 \cdot Zcs \cdot (Zoea - Zoe)}{Zoe^2} \quad (6)$$

So, for a known Zoe, and a desired Zoea, a central C frequency ω and a selected transmission line stub impedance Zcs there is a value of and that will satisfy our requirements.

Figure 10:
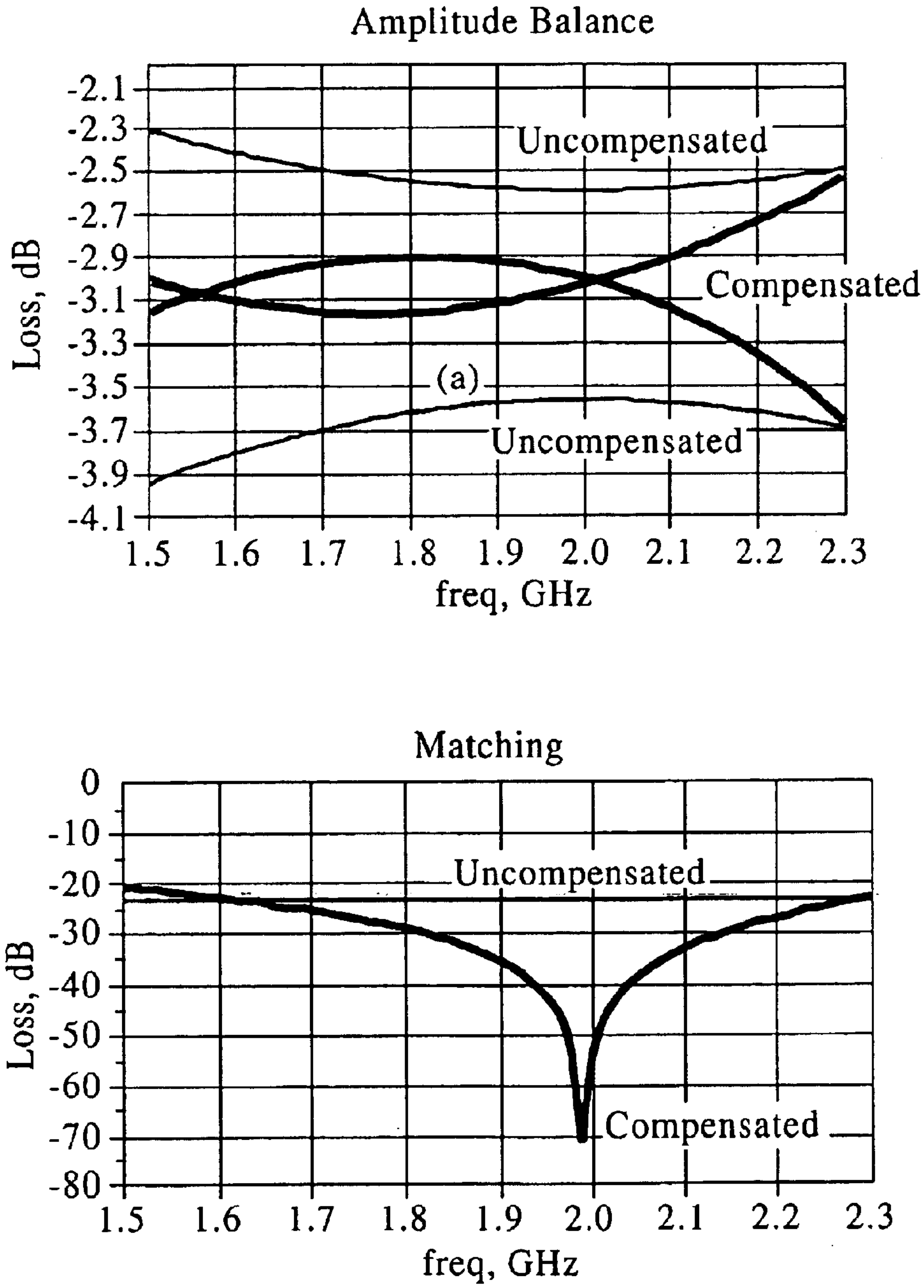
FIG. 10 shows diagrams of amplitude balance and matching versus frequency.

As shown in FIG. 10, one can verify the validity of the above expressions by the use of an idealised model of a symmetrically-coupled coupler as, for example, the CLIN Libra model provided within the HP-ADS design environment. With input Zoo=20.71 Ohms and Zoe=100 Ohms and a central frequency of 2 GHz, we can observe in FIG. 10 the amplitude response and Matching of the uncompensated coupler. Using expressions (5) and (6), with Zoea=120.7 Ohms and Zcs=50 Ohms, the values of and will be 0.137 pF and 78.3-degrees respectively. Simulating the coupler circuit with the addition of the short-circuit stub and capacitors to ground with the values stated above yields the result seen under the compensated results in FIG. 10. Not only does the matching improve but the amplitude response at the central-frequency also improves. If we use the normal-mode extraction equation according to Al-Taei, S.; et al; in "Design of High Directivity Directional Couplers in Multilayer Ceramic Technologies"; Microwave Symposium Digest; 2001 IEEE MTT-S International; Volume: 1; 2001; P. 51–54, we find that at the central frequency of the coupler (2 GHz) the effective even-mode impedance is 120.63 Ohms, very near the 120.7 Ohms required for perfect 3-dB coupling. It should be noted that the above expressions only considered the effect of the short circuit stub on the even-mode. The odd-mode has not been considered, as the effect in the first-order is negligible and will not be treated here.

Practical design follows the same process as outline above for the ideal case. However, parasitic effects, which are not considered in the above treatment, impact adversely on the first order response, so optimization of the initial result is required to produce the desire response. The first order results obtained from the above analysis provides good initial values for fast convergence. Before proceeding to a full Electro-Magnetic (EM) analysis design, it is advisable to make use of the 2-D EM design tools to reduce design effort, as simulation times and hence optimisation is much less time consuming.

Figure 11:
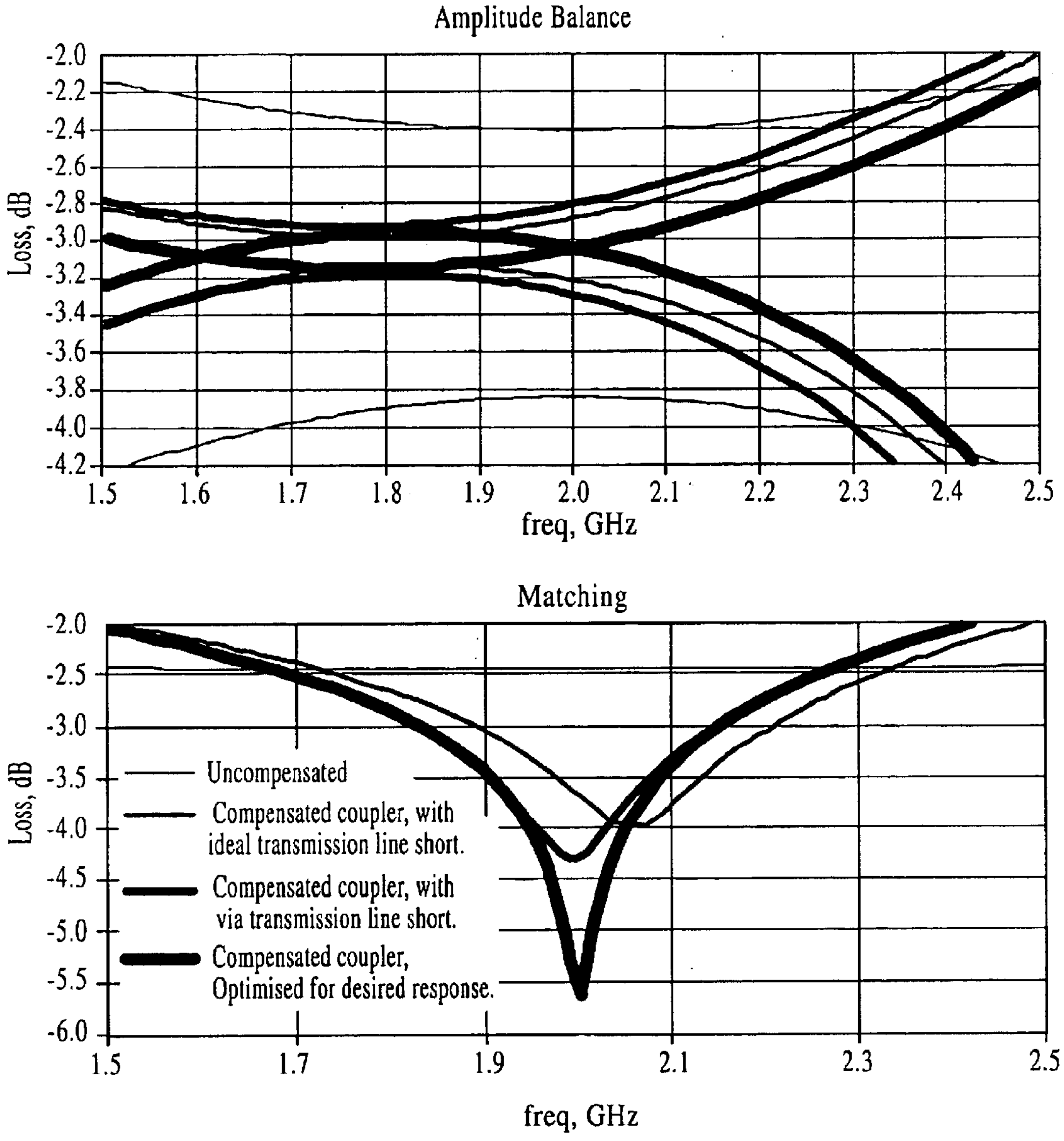
FIG. 11 shows further diagrams of amplitude balance and matching versus frequency
Figure 12:
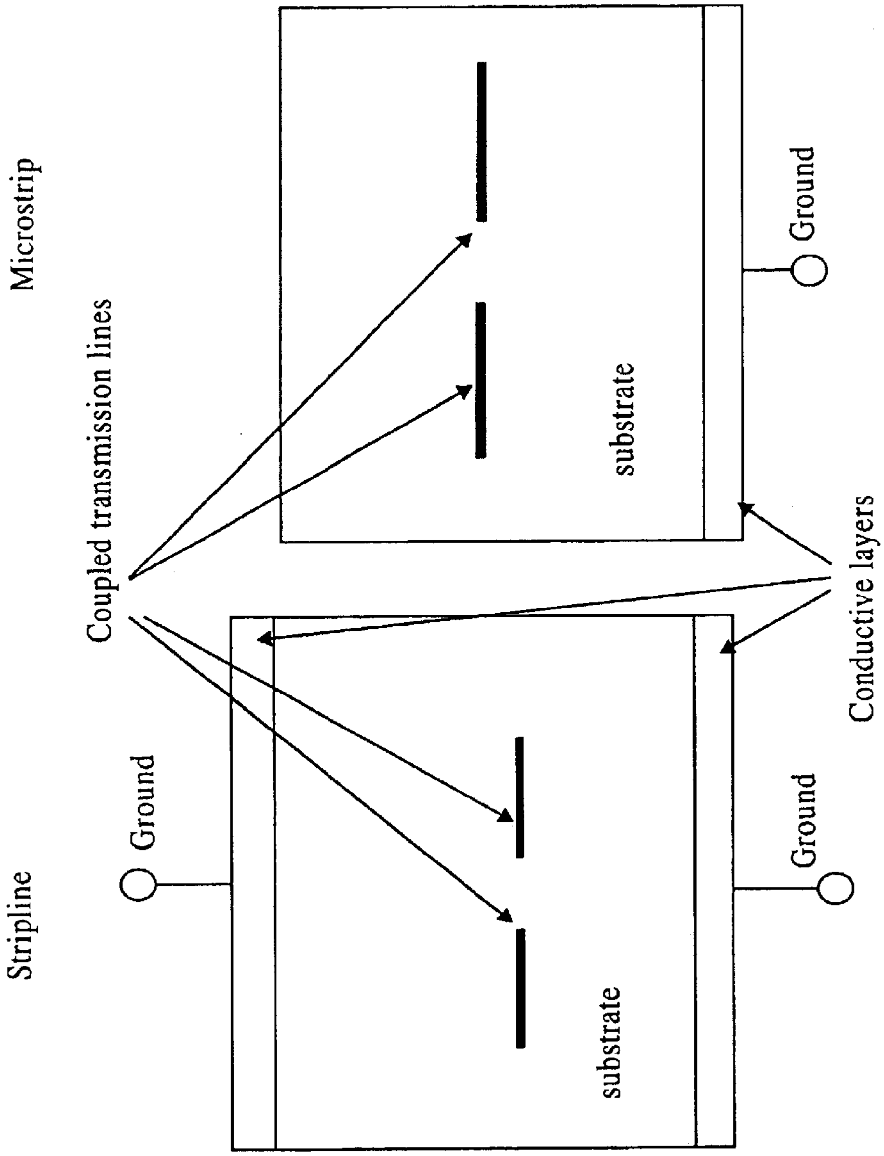
Fig. 12 PRIOR ART
FIG. 12 shows in a rough outline the basic difference between a stripline and microstrip arrangement.

FIG. 11 shows the amplitude and matching response of a practical coupler design. The coupler is designed within an LTCC substrate with relative dielectric constant (εr) of 7.8 and substrate thickness of about 1.1 mm. It should be noted that for a coupler transmission line width of 170 μm, which is optimised for the odd-mode, a substrate thickness of 2.1 mm is required to achieve the required even-mode impedance. This means that the compensated design is almost half the substrate thickness of the uncompensated stripline coupler. The cross sectional view in FIG. 7 shows the layer stack-up for the multilayer implementation of the compensated coupler.

In FIG. 11 there is a contrast between the result of the coupler after compensation where the short circuit transmission line stub is shorted ideally to ground in one instance and through a via in the second instance. The additional parasitic inductance of the via shows an adverse effect on the response that can be appreciated through the effect on Zoe, with Zoe=120.6 Ohms in the ideal short case, while it degenerated to Zoe=112.3 Ohms when the via is added. In the final stage, an optimisation routine is used in conjunction with the normal-mode parameter extraction equations, to yield the end result, where Zoe=120.7 Ohms and Zoo=20.7 Ohms, for a coupler of length 13.45 mm and of width 170 μm. The stub is 315 μm wide with an electric length of 73.2-degrees, and a capacitance of 0.17 pF for the capacitors to ground.

With this technique, when trying to reduce height of the stripline substrate, one increased the area that the coupler itself occupies by introducing short circuit stubs. However, this increased area may be reduced through creative layout designs such as that shown in FIG. 7. The coupler in FIG. 7 (top of page, layout representation) along with the short circuit stub is meandered to reduce overall area.

As previously mentioned, this invention is related to RF parts such as mixers and amplifiers. This invention reveals a signal coupling structure with a new compensation/matching method. The invention proposes a signal coupling structure with a new matching method. The example given is a quarter-wavelength coupler with two short-circuited stubs at the centre of the structure. Also capacitors in the ends of lines are used in a modification in order to compensate for discontinuity effects related to the usage of the short-circuited stubs. Due to the cost and manufacturability considerations, multilayer substrate thickness may need to be reduced. The reduction in substrate thickness harms the performance of the coupling structures by reducing the impedance. Low impedance of two coupled lines, results in poor general performance, such as matching, isolation, phase and amplitude balance of the coupling device. The low impedance of two-coupled lines is compensated by using buried short-circuit stubs in the multilayer structure according to the present invention. As an example, a broadside-coupled stripline coupler is used in a substrate with half the required thickness. Buried short-circuit stubs are used to match the even-mode impedance to levels required for higher performance. After the impedance matching is applied (i.e. with short-circuit stubs added), the performance of the coupled structure is improved. This structure allows reduction in substrate thickness and therefore saves cost. It also enables to produce high coupling (such as −3 dB) structures using LTCC/HTCC technologies. Furthermore, multiple short-circuited transmission line elements can be employed for wider bandwidth. Still further, putting the transmission lines in multiple layers, say 4, instead of 2, will further reduce the size making it a real 3-D component.

The invention presents a signal coupling structure and a new (parasitic-mode impedance) compensation method applied in a multilayer structure. The example given is a quarter-wavelength coupler with two short-circuit stubs at the centre of the structure. Low parasitic-mode impedance of two coupled lines, results in poor general performance, such as matching, isolation, phase and amplitude balance of the coupling device.

Due to cost and reliability considerations multilayer substrate thickness needs to be reduced. The reduction in substrate thickness harms the performance of coupling structures by reducing the parasitic-mode impedance. The reduced parasitic-mode impedance of two-coupled lines are compensated by using buried short-circuit stubs in the multilayer structure. As an example, a broadside-coupled stripline coupler is used in a substrate with half the required thickness. Buried short-circuit stubs are used to increase the parasitic-mode impedance to levels required for high performance. After the parasitic-mode impedance is compensated (i.e. with short-circuit stubs added), the performance of the coupled structure is improved significantly. As integrated in the multilayer ceramic substrate, this structure saves cost and allows significant reduction in substrate thickness. Also, it increases the reliability, while no SMD components are required. Electrical performance is significantly enhanced by the use of short-circuit stubs.

Summing up, it has been explained herein above that the implementation of stripline couplers carries a significant disadvantage in requiring a much larger thickness of substrate as compared to its microstrip counterpart to achieve the same performance for the same geometry. Hence, being able to design a stripline coupler with much reduced substrate thickness will be of great advantage. According to this invention, we have shown that by including at least one short circuit stub at e.g. the center of the coupled stipline coupler, optionally along with capacitors to ground at least one or even all four ports, we are able to compensate for the reduction in even-mode impedance with the reduction in substrate thickness. The invention indicates a set of simple expression that enables an accurate first order design.

Accordingly, as has been described herein above, conventional stripline implementations of couplers in Multilayer Ceramic Integrated Circuit (MCIC) technology incur a cost disadvantage when compared to an equivalent microstrip implementation. This is primarily due to the increased substrate thickness needed to achieve the required performance. Conventional stripline couplers significantly limit our ability to optimise for smaller substrate thickness and therefore overall cost. However, stripline couplers are needed for stacked integration scenarios and as building blocks for complex active and passive RF circuits in MCICs. A method of implementation that overcomes this practical disadvantages is therefore highly desirable. To this end, the present invention presents a novel coupling device structure that enable RF designers to use the stripline coupler configuration, by achieving required levels of performance with much reduced substrate thickness. The invention outlines a structured design procedure and presents simulation results confirming the validity of the technique. In particular, to achieve this, the present invention proposes a coupling device, comprising a substrate 1, a first conductive layer 2 covering a first surface of said substrate 1, at least two electromagnetically coupled lines 3_a_, 3_b_ being provided opposite to said first surface and being covered by at least one cover layer 4, 5, wherein at least one short-circuit stub Stub A, Stub B is connected between at least one of said electromagnetically coupled lines and said first conductive layer.

Finally, it is to be noted that all numerical values given herein are intended to represent mere examples only and do not limit the applicability of the invention to embodiments having these or like numerical values for the concerned variables. Rather, the present invention can be applied to a variety of couplers having dimensions/values fully independent of those indicated in this application for explanatory purposes only.

Although the present invention has been described herein above with reference to its preferred embodiments, it should be understood that numerous modifications may be made thereto without departing from the spirit and scope of the invention. It is intended that all such modifications fall within the scope of the appended claims.

What is claimed is:

1. A coupling device, comprising a substrate (1), a first conductive layer (2) covering a first surface of said substrate (1), at least two electromagnetically coupled lines (3_a_, 3_b_) being provided opposite to said first surface and being covered by at least one cover layer (4, 5), wherein at least one short-circuit stub (Stub B) is connected between at least one of said electromagnetically coupled lines and said first conductive layer.

2. A coupling device according to claim 1, wherein said at least one cover layer (4, 5) is covered by a second conductive layer (2'), and at least one short-circuit stub (Stub A, Stub B) is connected between at least one of said electromagnetically coupled lines and said second conductive layer.

3. A coupling device according to claim 2, wherein an even number of electromagnetically coupled lines is provided, and the number of short-circuit stubs connected to said first conductive layer is equal to the number of short-circuit stubs connected to said second conductive layer.

4. A coupling device according to claim 1, wherein said short-circuit stub is connected to an electromagnetically coupled line at half the electrical length of said line.

5. A coupling device according to claim 1, wherein said short-circuit stub is buried in the layered structure of the coupling device.

6. A coupling device according to claim 1, wherein at least one capacitor (C1, C2, C3, C4) is connected between a first end of at least one of said at least two lines (3_a_, 3_b_) and said first conductive layer (2).

7. A coupling device according to claim 2, wherein at least one capacitor (C1, C2, C3, C4) is connected between a first end of at least one of said at least two lines (3_a_, 3_b_) and said second conductive layer (2).

8. A coupling device according to claim 1, wherein said at least two lines (3_a_, 3_b_) are arranged at different distances form said first surface of said substrate (1).

9. A coupling device according to claim 8, wherein a difference between the distances in which said at least two lines (3_a_, 3_b_) are arranged from said first surface of said substrate (1) is determined by a thickness of a first cover layer (4) covering a first line (3_b_) of said at least two lines.

10. A coupling device according to claim 8, wherein a first line (3_b_) and a second line (3_a_) of said at least two lines are arranged such that they at least partly overlap each other.

11. A coupling device according to claim 9, further comprising a second cover layer (5) arranged to cover at least a second line (3_a_) of said at least two lines.

12. A coupling device according to claim 10, wherein the amount of overlap adjusts the degree of electromagnetic coupling between said at least two lines.

13. A coupling device according to claim 6, wherein said capacitor (C1, C4) is constituted by a conductive member (Cp1, Cp4) facing a conductive layer (2), and an electrical connection (W1, W4) from said first end of said at least one of said at least two lines (3_a_, 3_b_) to said conductive member (C1, C4).

14. A coupling device according to claim 13, wherein said connection is a via connection.

15. A coupling device according to claim 14, wherein the capacitance of said capacitor is determined by the area of said conductive member (P1, P4), the distance between said conductive member (P1, P4) and said conductive layer (2) covering said first surface of said substrate (1), and the dielectric constant of said substrate.

16. A coupling device according to claim 1, wherein said at least one cover layer (4, 5) is of the same material as said substrate (1).

17. A coupling device according to claim 1, wherein said substrate (1) is made of a dielectric material.

18. A coupling device according to claim 1, wherein said conductive layer (2, 2') is connectable to ground potential.

19. A coupling device according to claim 1, wherein a short-circuit stub is designed to have a specific impedance and electrical length.

* * * * *